United States Patent [19]

Cherukuri

[11] Patent Number: 4,952,531
[45] Date of Patent: Aug. 28, 1990

[54] SEALING GLASS FOR MATCHED SEALING OF COPPER AND COPPER ALLOYS

[75] Inventor: Satyam C. Cherukuri, West Haven, Conn.

[73] Assignee: Olin Corporation, New Haven, Conn.

[21] Appl. No.: 169,635

[22] Filed: Mar. 17, 1988

[51] Int. Cl.⁵ .................... C03C 3/085; C03C 3/105; C03C 3/091; C03C 3/108

[52] U.S. Cl. ........................................ 501/69; 501/60; 501/61; 501/62; 501/63; 501/65; 501/66; 501/72

[58] Field of Search ................... 501/72, 60, 61, 62, 501/63, 65, 66

[56] References Cited

U.S. PATENT DOCUMENTS

| | | | |
|---|---|---|---|
| 2,212,879 | 8/1940 | Kalsing et al. | 507/65 |
| 2,446,277 | 8/1948 | Gordon . | |
| 2,515,941 | 7/1950 | Stookey | 501/69 |
| 2,719,932 | 10/1955 | Stanworth | 501/65 |
| 2,776,900 | 1/1957 | Duncan | 501/69 |
| 2,782,319 | 2/1957 | McAlpine et al. | 501/72 |
| 2,948,992 | 8/1960 | Oldfield et al. | 501/69 |
| 3,341,369 | 9/1967 | Caule et al. . | |
| 3,407,091 | 10/1968 | Busdiecker . | |
| 3,473,999 | 10/1969 | Mochow . | |
| 3,475,227 | 10/1969 | Caule et al. . | |
| 3,498,803 | 3/1970 | Stookey | 501/72 |
| 3,522,039 | 7/1970 | McLain. | |
| 3,804,703 | 4/1974 | Hirayama . | |
| 3,808,154 | 4/1974 | Omori et al. | 501/69 |
| 3,826,627 | 7/1974 | Pryor et al. . | |
| 3,826,629 | 7/1974 | Pryor et al. . | |
| 3,939,295 | 2/1976 | Robertson | 501/69 |
| 4,185,139 | 1/1980 | Smermos . | |
| 4,434,016 | 2/1984 | Saleh et al. . | |
| 4,439,008 | 7/1984 | Joorman et al. | 501/69 |
| 4,445,754 | 5/1984 | Beales et al. | 501/72 |
| 4,472,030 | 9/1984 | Tachibawa et al. | 501/69 |
| 4,491,622 | 1/1985 | Butt . | |
| 4,524,238 | 6/1985 | Butt . | |
| 4,594,221 | 6/1986 | Caron et al. . | |
| 4,605,532 | 8/1986 | Knorr et al. . | |
| 4,656,499 | 4/1987 | Butt . | |
| 4,704,626 | 11/1987 | Mahulikar et al. . | |
| 4,712,161 | 12/1987 | Pryor et al. . | |

FOREIGN PATENT DOCUMENTS 817636 8/1959 United Kingdom .

Primary Examiner—Mark L. Bell
Attorney, Agent, or Firm—Gregory S. Rosenblatt; Paul Weinstein

[57] ABSTRACT

The present invention relates to a glass for making glass to metal seals. The coefficient of thermal expansion of the glass is in excess of $160 \times 10^{-7}$ in/in/°C. making the glass particularly useful for sealing copper and copper based alloys. The glass has particular utility in the manufacture of electronic packages and multi-layer circuitry.

8 Claims, 1 Drawing Sheet

SEALING GLASS FOR MATCHED SEALING OF COPPER AND COPPER ALLOYS

There are many metal-glass-ceramic applications and systems which have in common the bonding of a glass or ceramic material to the surface of a metal. One common application is in the manufacture of hermetic packages designed to enclose electronic devices such as silicon semiconductor devices.

Perhaps the most common hermetic package is the ceramic dual in line package commonly known as the CERDIP. The package contains a base component and a cover component made of aluminum oxide. The components are joined together, frequently with a metal leadframe disposed between, by a sealing glass. The glass is fabricated to have a coefficient of thermal expansion approximating that of the aluminum oxide components, about $49 \times 10^{-7}$ in/in/°C.

As semiconductor technology developed, the electronic devices became more complex. More electronic circuitry was positioned on smaller surface areas and as a result, the electronic device generated more heat during operation. Aluminum oxide has fairly poor thermal conductivity and as a result, alternatives to the CERDIP were developed.

Among these alternatives was the metal package. A metal or metal alloy replaced the aluminum oxide in forming the base and cover components of the package. Initially, low expansion alloys such as the iron-nickel-cobalt alloy known by the tradename KOVAR or low expansion metals such as molybdenum were used. Sealing glasses used for sealing CERDIP packages were adapted to the metal packages. To increase adhesion of the glass to the metal components, a thin layer of a metal oxide was formed on the surface of the base and cover components in accordance with technology known from the fabrication of glass to metal seals for the vacuum tube industry.

A glass suitable for bonding to molybdenum (coefficient of thermal expansion = $49 \times 10^{-7}$ in/in/°C.) containing $SiO_2$, $Al_2O_3$, MgO, $ZrO_2$, $TiO_2$ and $Li_2O$ is disclosed in U.S. Pat. No. 3,473,999 to Mochow.

As the semiconductor devices continued to increase in complexity, the need for package components with improved thermal conductivity also increased. Typically, there is a correlation between thermal conductivity and coefficient of thermal expansion. As the thermal conductivity increases, the coefficient of thermal conductivity likewise increases. Therefore, the higher conductivity electronic packages brought about a need for sealing glasses with higher coefficients of thermal expansion.

A sealing glass for stainless steel having a coefficient of thermal expansion of $120 \times 10^{-7} - 140 \times 10^{-7}$ in/in/°C. containing $SiO_2$, $K_2O$, $Na_2O$, $Al_2O_3$ and MgO is disclosed in U.S. Pat. No. 3,804,703 to Hirayama.

A sealing glass for nickel having a coefficient of thermal expansion of about $150 \times 10^{-7}$ in/in/°C. and containing $SiO_2$, $Na_2O$, $K_2O$, a mixture of (BaO,SrO and CaO) and $Al_2O_3$ is disclosed in U.S. Pat. No. 2,948,992 to Oldfield. Yet another relatively high expansion glass is known by the tradename CORNING 1990 and sold by Corning Glass Works located in Corning, N.Y. This glass contains $SiO_2$, $Li_2O$, $Na_2O$, $K_2O$ and PbO and has a coefficient of thermal expansion of about $136 \times 10^{-7}$ in/in/°C.

To maximize thermal conductivity, fabrication of components for electronic packages from copper or copper alloys is preferred. The coefficient of thermal expansion of these materials is in the range of from $160 \times 10^{-7} - 180 \times 10^{-7}$ in/in/°C. Glasses with coefficients of thermal expansion in the same range were required. Glasses have been developed which are close to the coefficient of thermal expansion of copper. For example, U.S. Pat. No. 3,407,091 to Busdiecker discloses a glass containing $Al_2O_3$, $K_2O$, ZnO and $P_2O_5$ for sealing to copper or copper alloys. The coefficient of thermal expansion of this glass was measured to be $141 \times 10^{-7}$ in/in/°C. However, if the mismatch between the glass and the substrate is much greater than about 10%, it has been found the glass will develop microcracks and hermeticity of the package will be lost.

Sealing glasses with coefficients of thermal expansion approximating that of copper have been made by adding a filler with a high coefficient of thermal expansion, such as calcium fluoride, to a sealing glass to achieve coefficients of thermal expansion about equal to that of copper. U.S. Pat. No. 4,185,139 to Smermos as well as U.S. Pat. No. 4,801,488 to Smith, III U.S. Pat. No. 4,752,521 to Smith III et al. disclose the use of a filler.

A problem with using a filler is excessive amounts of filler lead to a deterioration of the rheological properties that can affect seal integrity. As the sealing glass is heated, some of the filler is dissolved. Dissolution of $CaF_2$, one known filler, can lead to outgassing resulting in the dispersion of fluorine ions throughout the glass. The fluorine ions degrade the electrical resistivity and chemical durability of the glass. One approach to the problem of excessive dissolution is coating the filler as shown in U.S. Pat. No. 4,185,139 to Smermos. However, coating is difficult and does not solve the problem of excessive filler.

Lead oxide is a common component in sealing glasses. The lead oxide lowers the melting point of the glass. This is advantageous in glasses containing fillers as the lower the sealing temperature, the less dissolution. However, the nature of lead glasses restrict their use in reducing atmospheres and neutral atmospheres which are sometimes essential to control the oxidation behavior of the copper alloys.

In accordance with the present invention, a sealing glass is provided with a coefficient of thermal expansion approximately matching that of copper or copper based alloys, that is a coefficient of thermal expansion in the range of from about $160 \times 10^{-7}$ to about $180 \times 10^{-7}$ in/in/°C. The sealing glass is essentially lead and fluorine free and contains $SiO_2$, $Na_2O$, $K_2O$, BaO and $Al_2O_3$. The sealing glass is a homogeneous mixture of approximately the following ratio:

| | |
|---|---|
| $SiO_2$ | at least about 50 molar percent |
| $Na_2O$ | from about 5 to about 30 molar percent |
| $K_2O$ | from about 5 to about 30 molar percent |
| BaO | from about 10 to about 20 molar percent |
| $Al_2O_3$ | up to 5 molar percent |

The glass is sealed at temperatures up to about 800° C. without deterioration. High temperature stability permits the assembly of copper alloy packages which may be thermally treated subsequent to sealing. In a preferred embodiment, the copper package is age hardened subsequent to glass sealing.

Accordingly, it is an object of the present invention to provide a sealing glass which has a coefficient of thermal expansion approximately equal to that of copper or a copper based alloy.

It is a preferred feature of the invention that the glass is homogeneous and free of undissolved or partially dissolved fillers.

It is another feature of the invention that the glass is essentially free of fluorine and lead.

It is a feature of the invention that the glass has a melting temperature of about 800° C. permitting thermal aging of the assembled package.

These and other advantages will become more apparent from the following description and drawings.

Figure 1:
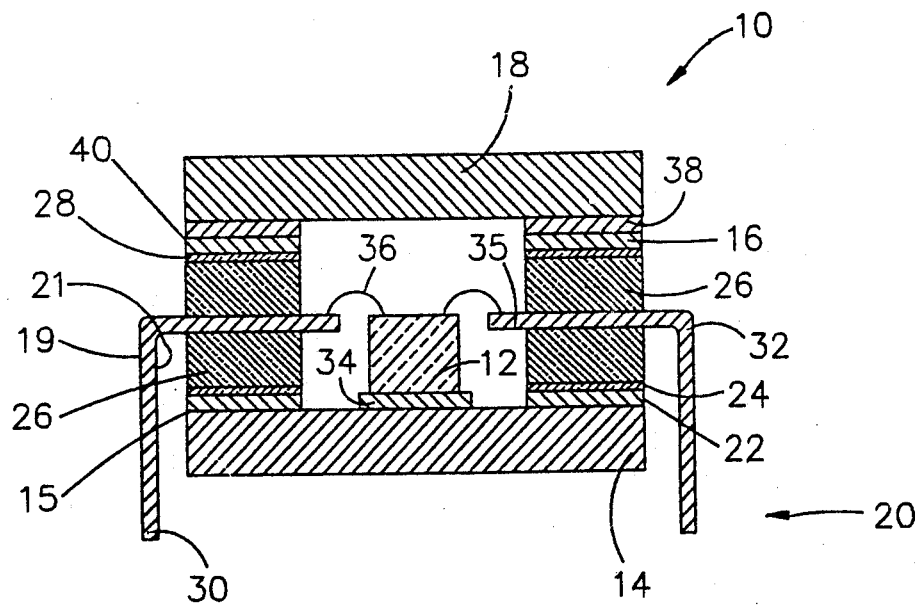
FIG. 1 shows in cross section an electronic package manufactured in accordance with the invention of this application.

The invention relates to sealing glasses for hermetic metal packages. The glasses are characterized by a coefficient of thermal expansion approximately matching a metal or metal alloy, preferably that of copper or a copper based alloy. More precisely, the coefficient of thermal expansion of the glass is in excess of about $160 \times 10^{-7}$ in/in/°C. Preferably, the coefficient of thermal expansion is in the range of from about $160 \times 10^{-7}$ in/in/°C. to about $180 \times 10^{-7}$ in/in/°C. and, most preferably, in the range of from about $165 \times 10^{-7}$ in/in/°C. to about $175 \times 10^{-7}$ in/in/°C.

The glasses are further preferably homogeneous, that is, without any undissolved fillers or other media present.

The glasses are preferably fluorine free and while lead oxide may be added to adjust the melting point as discussed below, the concentration of lead oxide is preferably low.

In a preferred composition, the glass contains $SiO_2$, BaO, a mixture of $Na_2O$ and $K_2O$, $Al_2O_3$ and possibly an additive to give the sealing glass desired properties.

The glass is predominantly comprised of silicon dioxide, at least about 50 molar percent. More preferably, the concentration of $SiO_2$ is from about 55 molar percent to about 65 molar percent and, most preferably, the concentration is from about 58 molar percent to about 60 molar percent.

The barium oxide component is preferably present in concentrations of from about ten molar percent to about twenty molar percent. It has been found that barium oxide is a major contributor to the thermal expansion coefficient of the glass composite. The desired concentration of BaO is determined by the coefficient of thermal expansion of the metal alloy which is being sealed. For most copper or copper based alloys, it has been found that a BaO concentration of from about twelve to about fifteen molar percent is most preferred.

An alkaline oxide component is included. The alkaline oxide component is preferably comprised of about equal molar concentrations of two alkaline oxides. The use of about equal molar concentrations of two alkaline oxides takes advantage of the "Mixed Alkali Effect". The "Mixed Alkali Effect" predicts that the diffusion of alkali ions is drastically reduced when those alkali ions are present in equi-molar proportions rather than a single alkali ion with the molar concentration of the sum. Lower diffusion rates will increase the electrical resistivity of the sealing glass, thereby isolating the leadframe from the electronic package components. As disclosed in U.S. Pat. No. 3,804,703 to Hirayama, the "Mixed Alkali Effect" also seems to improve the moisture resistance of the glass and increase the coefficient of thermal expansion. While other alkali oxides may be used, namely the oxides of lithium, rubidium and/or cesium, it has been found the maximum increase in coefficient of thermal expansion is obtained with a mixture of $Na_2O$ and $K_2O$.

The concentration of total alkaline oxide is preferably from about twenty molar percent to about thirty molar percent and, more preferably, from about 25 molar percent to about 28 molar percent. For example, about 14 molar percent $Na_2O$ and 14 molar percent $K_2O$.

Preferably, a small amount of aluminum oxide is also added to the glass. It has been found that aluminum oxide increases the chemical resistance of the glass. The aluminum oxide serves to lower the coefficient of thermal expansion of the glass and, therefore, is preferably in a concentration of up to about 5 molar percent and, more preferably, in a concentration of from about 0.5 molar percent to about 3 molar percent.

Various other additives may be combined with the glass, generally in concentrations of less than about 10 molar percent. For example, small amounts of lead oxide will lower the melting point of the glass. Other additives which may be combined with the glass include, but are not limited to $Li_2O$, $B_2O_3$, $P_2O_5$, MgO, CaO, $GeO_2$ and SrO.

As an illustrative example, which is not intended to limit the invention, the following glass composition has been found to give a coefficient of thermal expansion of $167 \times 10^{-7}$ in/in/°C. and have good chemical and electrical resistance.

| Oxide | Molar % | Weight % |
| --- | --- | --- |
| $SiO_2$ | 58.5 | 44.81 |
| $Na_2O$ | 13.0 | 10.27 |
| $K_2O$ | 13.0 | 15.61 |
| BaO | 14.0 | 27.36 |
| $Al_2O_3$ | 1.5 | 1.95 |

The glass has a sealing temperature of about 750° C. which is particularly suited for the manufacture of "window frame" packages as described hereinbelow.

FIG. 1 illustrates in cross section a hermetic metal package 10 adapted to house an electronic device 12, usually a silicon based semiconductor. Hermetic metal packages are disclosed in U.S. Pat. No. 4,524,238 to Butt and U.S. Pat. No. 4,656,499 to Butt and both are hereby incorporated by reference in the present application.

The package 10 is comprised of a base component 14, a window frame 16 and a cover component 18. A leadframe 20 is disposed between the window frame 16 and base component 14 and serves to electrically connect the electronic device 12 to external circuitry.

While copper or a copper alloy may be used to manufacture the package components, copper alloys which form refractory oxides such as copper alloys C6381, C724 and C7025 are preferred for their glass sealing capabilities. These and other copper alloys which form a surface refractory oxide when heated in an oxidizing atmosphere are referred to herein as alloys which form a glass sealable layer "in situ".

Other copper alloys may be coated with a glass sealable oxide forming metal or metal alloy by cladding as disclosed in the above U.S. Pat. No. 4,524,238 to Butt. Plating, vapor deposition or sputtering as disclosed in U.S. Pat. No. 4,796,083 entitled "SEMICONDUCTOR CASING", filed on July 2, 1987, by Cherukuri et al. may also be used to deposit a material which forms a refractory or glass sealable oxide onto the surface of the package components. This process is referred to herein as forming a glass sealable layer by an "additive" process.

Alloy 6381 contains 2.5–3.1% aluminum, 1.5–2.1% silicon and the balance copper as described in U.S. Pat. Nos. 3,341,369 and 3,475,227 issued to Caule et al. A refractory oxide layer formed substantially of aluminum oxide ($Al_2O_3$) may be produced by any desired method. For example, the alloy may be preoxidized by heating to a temperature of between about 330° C. and 820° C. in gases having a extremely low oxygen content such as 4% hydrogen, 96% nitrogen and a trace of water.

Alloy C6381 may not be preferred for all packaging applications. The alloy anneals at glass sealing temperatures and the assembled package is subject to distortion and damage due to its softened state. A more preferred alloy would be a precipitation hardened alloy suitable for glass sealing such as copper alloy C724.

Alloy C724 consists essentially of from about 10% to about 15% nickel, from about 1% to about 3% aluminum, up to about 1% manganese, from about 0.05% to less than about 0.5% magnesium and the balance copper as disclosed in U.S. Pat. No. 4,434,016 to Saleh et al.

The use of alloy C724 as well as other precipitation hardened alloys for leadframes in glass sealed metal packages is disclosed in U.S. Pat. No. 4,704,626 to Mahulikar which is hereby incorporated by reference in the present application.

Another preferred copper based alloy, C7025, consists essentially of from about 2 to about 4.8 weight percent nickel, from about 0.2 to about 1.4 weight percent silicon, from about 0.05 to about 0.45 weight percent magnesium and the balance copper. Alloy C7025 is disclosed in U.S. Pat. No. 4,594,221 to Caron et al. Alloy C7025 achieves maximum hardness when aged at a temperature of about 450° C. for about 2 hours.

The aging properties of precipitation hardenable copper alloys has been exploited in glass sealed metal packages. U.S. patent application Ser. No. 2,532, entitled "PROCESS FOR PRODUCING FORMABLE AND HIGH STRENGTH LEADFRAMES FOR SEMICONDUCTOR PACKAGES", filed on Jan. 12, 1987, by Mahulikar et al. teaches a process of providing a leadframe formed from a precipitation hardenable copper alloy in the homogeneous or softened state, bending the leadframe to shape, and then glass sealing the package using a glass which seals at about the age hardening temperature of the leadframe alloy so that the alloy is age hardened during glass sealing.

Precipitation hardenable alloys are referred to as being in the solution treated or homogeneous state when they are single phase. These alloys are rather ductile. When the alloys are in the precipitation or age hardened state, they are multi-phase. These alloys are less ductile. By controlled heating and cooling, an alloy may be transferred from solution treated to age hardened or from age hardened to solution treated.

An advantage of the glass of the present invention is it softens at temperatures above 700° C. so that a precipitation hardenable leadframe may be glass sealed in the solution treated state, bent to a desired shape, and then age hardened without the properties of the glass being degraded.

Nothing in the above is intended to limit the package components to precipitation hardened alloys or to a single alloy. For example, the base component 14 may be comprised of oxygen free (OFHC) copper or a high conductivity copper alloy such as alloy C194 (1.5%–3.5% iron and small amounts of zinc or mixtures of zinc and phosphorous and the balance copper as disclosed in U.S. Pat. No. 3,522,039 to McLain) or alloy C197 (0.3%–1.6% iron, 0.01%–0.20% magnesium, 0.10%–0.40% phosphorous, up to 0.5% tin or antimony or mixtures thereof and the balance copper as disclosed in U.S. Pat. No. 4,605,532 to Knorr et al.) to facilitate the removal of heat from the electronic device. The leadframe 20, the window frame 16 and the cover component 18 may be formed from a precipitation hardenable alloy to give the package 10 extra strength. Any desired combination of materials could be employed.

Referring back to FIG. 1, an illustrative example of a glass sealed metal package 10 in accordance with the present invention is illustrated. A base component 14 is preferably formed from a high conductivity alloy such as C194 or C197 containing a glass sealable layer 22 on at least a first surface 15 and, preferably, the edges of the package as well. The glass sealable layer is preferably a metal oxide or refractory oxide layer and may be applied by cladding. For example, cladding a layer of alloy C6381 on the surface of the base component. Other additive processes such as plating, sputtering or vapor deposition may also be used. If cladding is utilized, the clad is often several mils thick and it may be desirable to remove the cladding from that portion of the base component which will bond to the chip 12 to increase thermal conductivity. If plating, sputtering or vapor deposition is used, the refractory layer may be formed from nickel, silicon or other materials as disclosed in U.S. Pat. No. 4,796,083. The coating is generally much thinner and it is usually not necessary to remove the coating form the bonding site. The refractory layer 22 is then oxidized to form a refractory oxide 24 on the bonding surface of the refractory layer. A sealing glass 26 with a composition in accordance with the present invention is applied to the refractory oxide by any applicable technique, for example, screening.

A similar process provides a window frame 16 with a refractory oxide 28 on at least one surface. As the window frame does not contribute significantly to the thermal dissipation of the package and is useful to increase the strength of the package, the window frame is preferably a precipitation hardened alloy which is capable of forming a refractory oxide such as C724 or C7025. A glass 26 with a composition in accordance with the present invention is applied to the refractory oxide layer 28 of the window frame 16.

A leadframe 20, preferably formed from a precipitation hardenable alloy for strength, although a high conductivity copper alloy such as C194 or C197 may be used, is disposed between the base component and the window frame in contact with the two layers of sealing glass 26. To improve the glass to metal bond, it is often desirable to supply a refractory oxide layer to first 19 and second 21 sides of the leadframe 20.

The assembly is then fired in a furnace at a temperature of about 700° C. to about 800° C. and, more preferably, at a temperature of from about 740° C. to about 760° C. for a time of about 10 minutes to about 60 minutes and, preferably, of about 25 to about 35 minutes. The furnace atmosphere may be neutral or oxidizing, generally dependent on the composition of the package components. If the components are preoxidized, a neutral or reducing atmosphere, such as 4% $H_2$, 96% $N_2$ may be used. If the components are not preoxidized, a slightly oxidizing atmosphere, such as air or nitrogen with a trace of water may be used.

After sealing, the leadframe is in the solution treated state and the lead end portions 30 of the leadframe 20 may be bent to a desired radius 32 without damaging the glass. The glass is then preferably annealed to remove residual stresses which may develop during sealing. Annealing at temperatures of from about 400° C. to about 500° C. is exemplary while temperatures from about 400° C. to about 450° C. are preferred and about 430° C. is most preferred. The annealing time is up to about 2 hours and, preferably, from about 20 minutes to about 1 hour and, most preferably, about 25 to about 35 minutes. It is an advantage of the glass of the present invention that the annealing temperature of the glass matches the age hardening temperature range for the desired precipitation hardenable copper alloys. While the glass is annealed, the copper alloy hardens producing an electronic package of superior strength.

An electronic device 12 is next bonded to the base component by any known die attach system. The glass is not deteriorated by die attach temperatures so any suitable material may be used for the die attach 34. This is a distinct advantage over previously known glasses which may degrade at temperatures in excess of about 350° C. The electronic device 12 is then electrically connected to lead fingers 35 by a known process such as wire bonding 36.

The cover component 18 is then attached to the second side of the window frame 16 by a suitable bonding component 38. The sealing glass is thermally stable at temperatures of up to about 700° C., so the bonding component 38 is selected to have a melting temperature low enough to avoid damage to the electronic device and softening of the precipitation hardened copper alloys. It is preferable to select a bonding component which seals at temperatures less than about 400° C. Most conventional CERDIP bonding components, for example, low temperature solder glasses or alloys such as 80% by weight gold and 20% by weight tin or lead-tin alloys are acceptable.

The second surface 40 of the window frame and the cover component 18 are supplied with a refractory oxide, if a solder glass is used as the bonding component 38. If a metallic component is used, it is preferable to have the second surface 40 and cover component 18 bare metal or plated with a metal such as gold or tin to enhance solder wettability.

The package containing the window frame and cover component with a suitable bonding component disposed therebetween is heated to seal the cover component to the package, thereby completing the hermetic package 10 in accordance with the present invention.

The present invention is not limited to hermetic metal packages as described above. The sealing glass may be used in combination with a metal or any metal alloy where an approximate match in coefficients of thermal expansion is desired.

Figure 2:
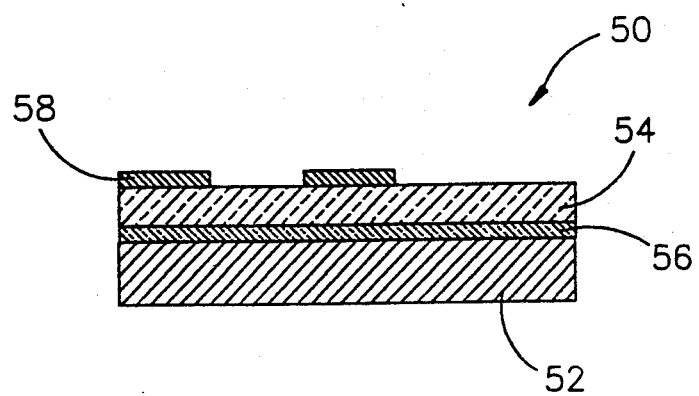
FIG. 2 shows in cross section a glass-metal composite material manufactured in accordance with the invention of this application.

Referring to FIG. 2, a glass-metal composite 50 is shown in cross section.

The composite is comprised of a metal substrate 52 and a glass layer 54. Generally, a glass sealable layer 56 is disposed between the metal substrate and the glass layer. The glass sealable layer may be a metal oxide or a refractory oxide as described hereinabove and may be applied by the techniques described above.

The composite may be used to fabricate a circuit assembly such as a printed circuit board or a chip carrier. A circuit assembly is disclosed in U.S. Pat. No. 4,491,622 to Butt. A metal foil layer 58 may be bonded to the glass as disclosed in U.S. Pat. No. 4,712,161 to Pryor et al. Since the glass has a coefficient of thermal expansion approximately equal to that of copper, a copper or copper alloy substrate may be used to take advantage of the high thermal conductivity of the copper.

Figure 3:
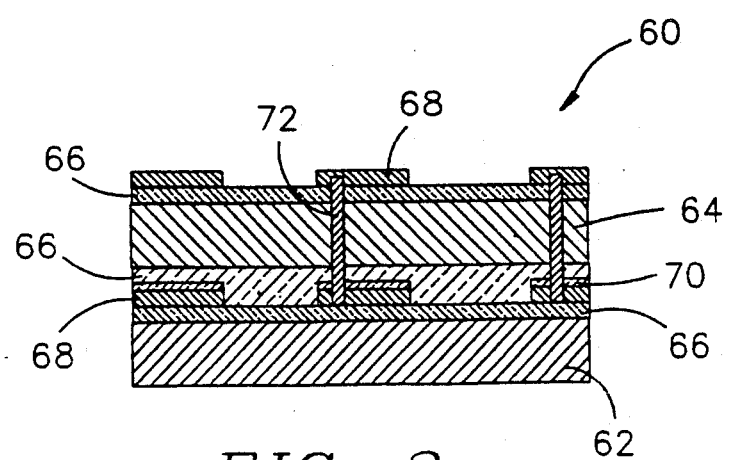
FIG. 3 shows in cross section a multi-layer circuit manufactured in accordance with the invention of this application.

As shown in FIG. 3, the sealing glass of the present invention may be used as a bonding glass for multi-layer circuits. A multi-layer circuit board 60 is comprised of first 62 and second 64 substrates. The substrates are any metal or metal alloy with a coefficient of i: thermal expansion in excess of $160 \times 10^{-7}$ in/in/°C. and, preferably, copper or a copper alloy. The bonding glass 66 is applied to at least one surface of each substrate as disclosed above and a layer of copper foil 68 is also added. It may be desirable to provide glass sealable layers 70 to the substrate and foil to facilitate glass sealing. The substrates are then stacked and bonded together.

The copper foil layers 68 are formed into circuit patterns, for example, by selectively applying a resist and then chemically etching away the uncovered portions of foil. Insulated conductive through-holes 72 may also be provided to supply electrical contact from one foil layer to the next.

Since the coefficient of thermal expansion of the glass, substrates and foil layers closely match, the multi-layer circuit is not limited to two layers as shown in FIG. 3. Any number of substrates and foil layers may be used with through-hole supplying electrical interconnection.

The composite is also useful as a decorative laminate. The glass limits oxidation and corrosion of the underlying substrate. Examples of decorative composite material formed from a metallic substrate and a glass layer may be found in U.S. Pat. Nos. 3,826,627 and 3,826,629 both to Pryor et al. The laminate is useful for plumbing fixtures, bathroom fixtures or jewelry or other uses for an enameled metal. The coefficient of thermal expansion of a composite manufactured according to the present invention is close to that of copper or a copper alloy. Any application requiring enameled copper could preferably be made using the present glass and a copper or copper alloy substrate.

The advantages of a glass with a coefficient of thermal expansion which matches that of copper or a copper based alloy is not limited to electronic and decorative applications. Any place a matched seal between glass and a high expansion alloy is required would benefit from the use of the glass of the present invention.

A useful applications would be matched glass to metal seals in vacuum devices. These devices may be used for electrical devices such as disclosed in U.S. Pat. No. 2,446,277 to Gordon or a pressurized vessel requiring glass to metal seals such as a chemical reaction chamber or even a submarine. The vessel need not be under vacuum, it may be pressurized or at atmospheric pressure.

The patents and patent applications set forth in this application are intended to be incorporated in their entireties by reference herein.

It is apparent there has been provided in accordance with this invention a sealing glass suitable for the assembly of hermetic metal packages and the packages so produced which satisfy the objects means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. A sealing glass comprised of a homogeneous mixture of oxides, consisting essentially of:
   at least 50 molar percent $SiO_2$;
   from about 12 to about 15 molar percent BaO such that said sealing glass has a coefficient of thermal expansion of from about $165 \times 10^{-7}$ in/in/°C. to about $175 \times 10^{-7}$ in/in/°C.;
   from about twenty to about thirty molar percent of an alkaline oxide component, said alkaline oxide component comprised of at least two alkaline oxides selected from the group consisting of $Na_2O$, $K_2O$ and $Li_2O$;
   from about 0.5 molar percent to about five molar percent $Al_2O_3$; and
   up to about ten molar percent of an additive selected from the group consisting of $B_2O_3$, $P_2O_5$, MgO, CaO, $GeO_2$, SrO, PbO and mixtures thereof.

2. The sealing glass of claim 1 wherein said at least two alkaline oxides are in essentially equal molar quantities.

3. The sealing glass of claim 2 wherein said concentration of $SiO_2$ is in the range of from about fifty five molar percent to about sixty five molar percent.

4. The sealing glass of claim 3 wherein said concentration of $SiO_2$ is in the range from about fifty-eight molar percent to about sixty molar percent.

5. The sealing glass of claim 4 wherein said concentration of said alkaline oxide component is in the range of from about twenty-five molar percent to about twenty-eight molar percent.

6. The sealing glass of claim 5 wherein said alkaline oxide component is comprised of essentially equal molar concentrations of $Na_2O$ and $K_2O$.

7. The sealing glass of claim 6 wherein the concentration of the $Al_2O_3$ component is in the range of from about 0.5 molar percent to about three molar percent.

8. A sealing glass comprised of a homogeneous mixtures of oxides having the composition in molar percent of 58.5 percent $SiO_2$, 13.0 percent $Na_2O$, 13.0 percent $K_2O$, 14.0 percent BaO and 1.5 percent $Al_2O_3$.

* * * * *